(12) United States Patent
Liu et al.

(10) Patent No.: US 8,928,120 B1
(45) Date of Patent: Jan. 6, 2015

(54) WAFER EDGE PROTECTION STRUCTURE

(71) Applicant: Taiwan Semiconductor Manufacturing Company Limited, Hsin-Chu (TW)

(72) Inventors: Ming Chyi Liu, Hsinchu (TW); Sheng-de Liu, Zhongli (TW); Chi-Ming Chen, Zhubei (TW); Yuan-Tai Tseng, Zhubei (TW); Chung-Yen Chou, Hsinchu (TW); Chia-Shiung Tsai, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/930,218

(22) Filed: Jun. 28, 2013

(51) Int. Cl.
| H01L 29/06 | (2006.01) |
| H01L 31/102 | (2006.01) |
| H01L 21/30 | (2006.01) |
| H01L 21/46 | (2006.01) |
| H01L 21/00 | (2006.01) |
| H01L 23/00 | (2006.01) |
| H01L 21/32 | (2006.01) |

(52) U.S. Cl.
CPC .............. H01L 23/562 (2013.01); H01L 21/32 (2013.01)
USPC ........... 257/619; 257/452; 438/455; 438/459; 438/464; 438/465

(58) Field of Classification Search
USPC ........... 438/455, 459, 464, 465; 257/452, 619
See application file for complete search history.

(56) References Cited

U.S. PATENT DOCUMENTS

| 6,030,879 | A  | * | 2/2000 | Huang et al. ................... 438/397 |
| 8,252,665 | B2 | * | 8/2012 | Chiou et al. .................... 438/459 |
| 8,409,953 | B2 | * | 4/2013 | Yoon et al. ...................... 438/268 |
| 2010/0248427 | A1 | * | 9/2010 | Wu et al. ........................ 438/118 |
| 2013/0029475 | A1 | * | 1/2013 | Tsukamoto ................... 438/459 |

* cited by examiner

*Primary Examiner* — Evan Pert
*Assistant Examiner* — Gustavo Ramallo
(74) *Attorney, Agent, or Firm* — Cooper Legal Group, LLC

(57) ABSTRACT

Among other things, one or more wafer edge protection structures and techniques for forming such wafer edge protection structures are provided. A substrate of a semiconductor wafer comprises an edge, such as a beveled wafer edge portion, that is susceptible to Epi growth which results in undesirable particle contamination of the semiconductor wafer. Accordingly, a wafer edge protection structure is formed over the beveled wafer edge portion. The wafer edge protection structure comprises an Epi growth resistant material, such as an amorphous material, a non-crystalline material, oxide, or other material. In this way, the wafer edge protection structure mitigates Epi growth on the beveled wafer edge portion, where the Epi growth increases a likelihood of particle contamination from cracking or peeling of an Epi film resulting from the Epi growth. The wafer edge protection structure thus mitigates at least some contamination of the wafer.

20 Claims, 18 Drawing Sheets

WAFER EDGE PROTECTION STRUCTURE

BACKGROUND

During semiconductor fabrication, particles can contaminate a semiconductor wafer, which can result in defects and reduced device yield from the semiconductor wafer. For example, epitaxial growth (Epi growth) can occur near a wafer edge of a semiconductor wafer because the semiconductor wafer can comprise a material, such as silicon or other crystalline material, which is susceptible to Epi growth. An Epi film can form near the wafer edge from the Epi growth. Cracking or peeling of the Epi film can result in defects and undesirable particle issues that can contaminate the semiconductor wafer.

DETAILED DESCRIPTION

Figure 1:
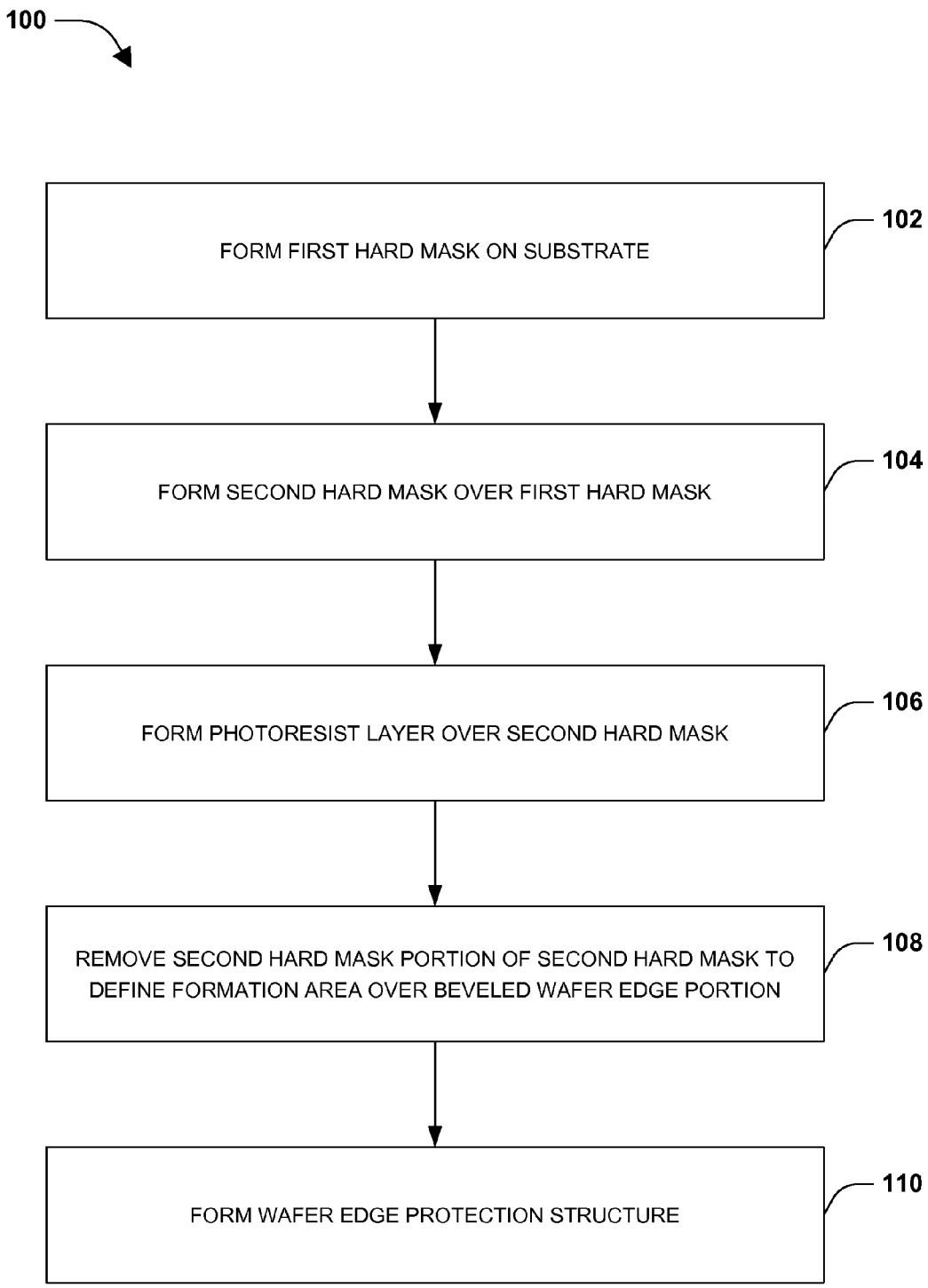
FIG. 1 is a flow diagram illustrating a method of forming a wafer edge protection structure for a beveled wafer edge portion of a semiconductor wafer, according to some embodiments.
Figure 2:
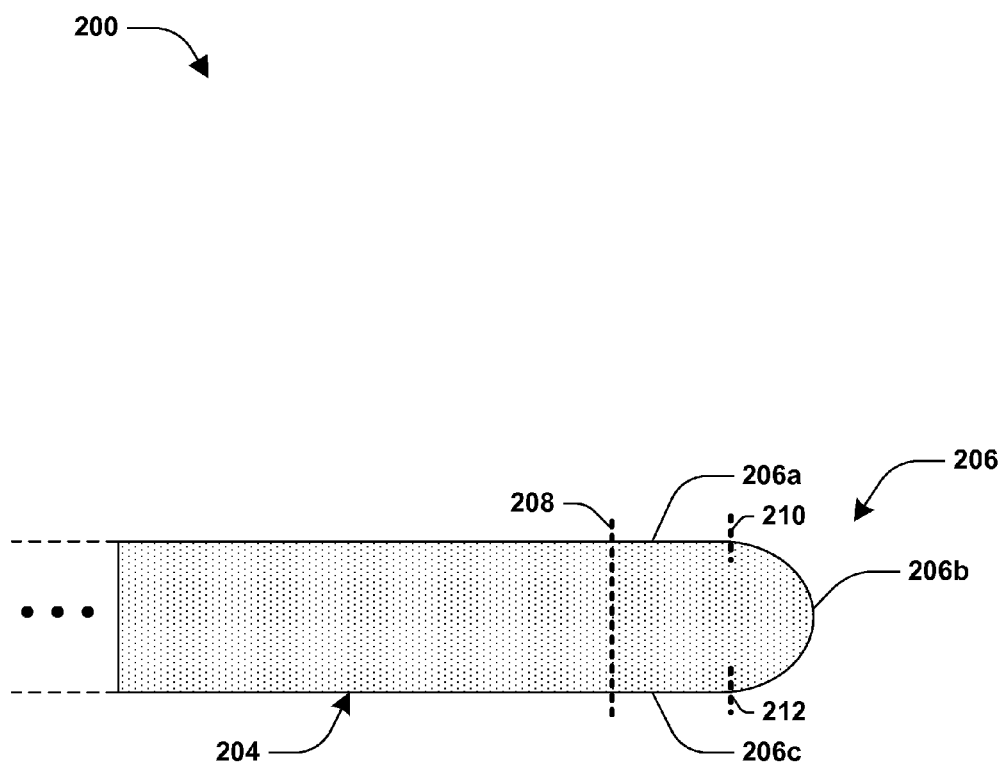
FIG. 2 is an illustration of a substrate comprising a beveled wafer edge portion, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more wafer edge protection structures and one or more techniques for forming such wafer edge protection structures are provided herein. In an embodiment, a semiconductor wafer comprises a substrate. In an embodiment, the substrate comprises silicon, a crystalline material, or other material that is susceptible to Epi growth. In an embodiment, the substrate comprises a beveled wafer edge portion, such as a wafer edge of the semiconductor wafer that comprises a beveled shaped or other shape having angles different than 90 degrees. Accordingly, a wafer edge protection structure is formed over at least some of the beveled wafer edge portion. In an embodiment, the wafer edge protection structure comprises an amorphous material, an oxide material, a non-crystalline material, or other material that is not susceptible to Epi growth. In this way, Epi growth on the beveled wafer edge portion is mitigated, which results in reduced particle contamination that otherwise results from cracking or peeling of an Epi film that is part of the Epi growth.

A method 100 of forming a wafer edge protection structure for a beveled wafer edge portion of a semiconductor wafer is illustrated in FIG. 1, and one or more wafer edge protection structures formed by such a methodology are illustrated in FIGS. 2-8. A semiconductor wafer comprises a substrate 204, as illustrated in embodiment 200 of FIG. 2. The substrate 204 comprises a beveled wafer edge portion 206 (e.g., an edge region of the substrate 204 to the right of a line 208 drawn through the substrate 204 for illustrative purposes). In some embodiments, the beveled wafer edge portion 206 comprises a top beveled wafer edge portion 206a (e.g., between line 208 and line 210), a side beveled wafer edge portion 206b (e.g., between line 210 and line 212), a bottom beveled wafer edge portion 206c (e.g., between line 212 and line 208), or other beveled wafer edge portions not illustrated. In this way, the beveled wafer edge portion 206 has a beveled shaped or other edge shape.

Figure 3:
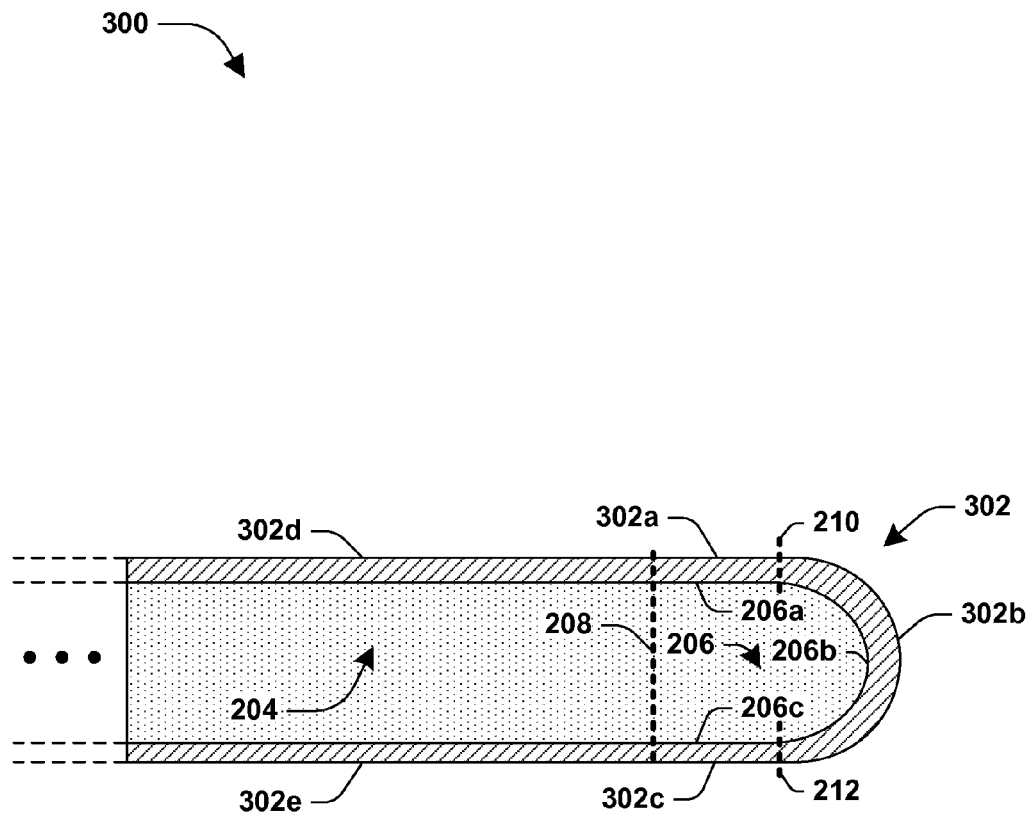
FIG. 3 is an illustration of first hard mask, according to some embodiments.

At 102, a first hard mask 302 is formed on the substrate 204 of the semiconductor wafer, as illustrated in embodiment 300 of FIG. 3. In an embodiment, the first hard mask 302 comprises an amorphous material, a non-crystalline material, or other material that is relatively less susceptible to Epi growth than the substrate 204. In an embodiment, the first hard mask 302 comprises an oxide material. In an embodiment, an oxide growth technique, such as thermal oxide growth, is performed to form the first hard mask 302. In some embodiments, the first hard mask 302 comprises a top first hard mask portion 302d (e.g., to the left of the line 208), a beveled top first hard mask portion 302a (e.g., between the line 208 and the line 210), a beveled edge first hard mask portion 302b (e.g., between the line 210 and the line 212), a beveled bottom first hard mask portion 302c (e.g., between the line 212 and the line 208), a bottom first hard mask portion 302e (e.g., to the left of the line 208), or other portions not illustrated. In an embodiment, the beveled top first hard mask portion 302a, the beveled edge first hard mask portion 302b, and the beveled bottom first hard mask portion 302c are formed on the beveled wafer edge portion 206. In an embodiment, the first hard mask 302 is formed to a thickness between about 50 A and about 100 A. In an embodiment, the first hard mask 302 wraps around the beveled wafer edge portion 206 from a front or top side of the substrate 204, around the beveled edge portion 206, to a back or bottom side of the substrate 204.

Figure 4:
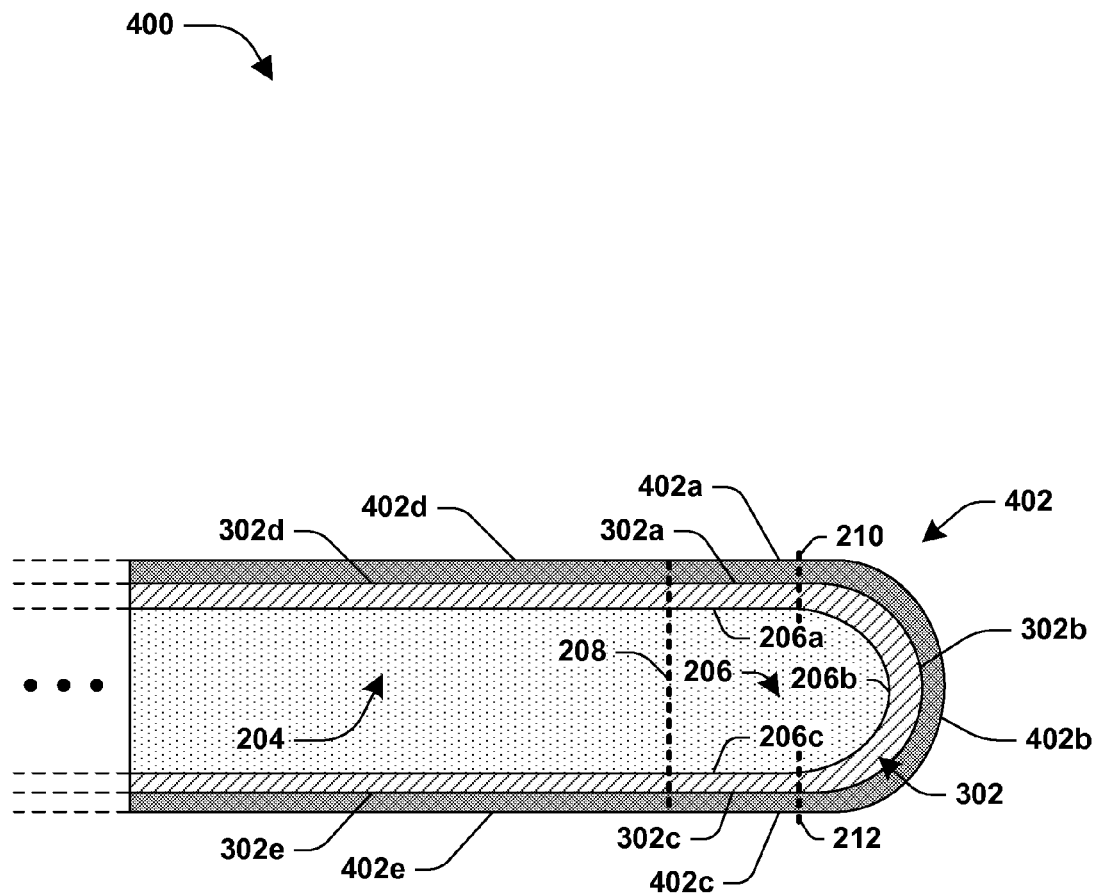
FIG. 4 is an illustration of a second hard mask, according to some embodiments.

At 104, a second hard mask 402 is formed over the first hard mask 302, as illustrated by embodiment 400 of FIG. 4. In an embodiment, the second hard mask 402 comprises nitride, silicon nitride, or other material. In an embodiment, a nitride growth technique is performed to form the second hard mask 402. In some embodiments, the second hard mask 402 comprises a top second hard mask portion 402d (e.g., to the left of the line 208), a beveled top second hard mask portion 402a (e.g., between the line 208 and the line 210), a beveled edge second hard mask portion 402b (e.g., between the line 210 and the line 212), a beveled bottom second hard mask portion 402c (e.g., between the line 212 and the line 208), a bottom second hard mask portion 402e, or other portions not illustrated. In an embodiment, the beveled top second hard mask portion 402a, the beveled edge second hard mask portion 402b, and the beveled bottom second hard mask portion 402c are formed on the beveled wafer edge portion 206. In an embodiment, the second hard mask 402 is formed to a thickness between about 50 A and about 100 A. In an embodiment, the second hard mask 402 wraps around the beveled wafer edge portion 206 from a front or top side of the substrate 204, around the beveled edge portion 206, to a back or bottom side of the substrate 204.

Figure 5:
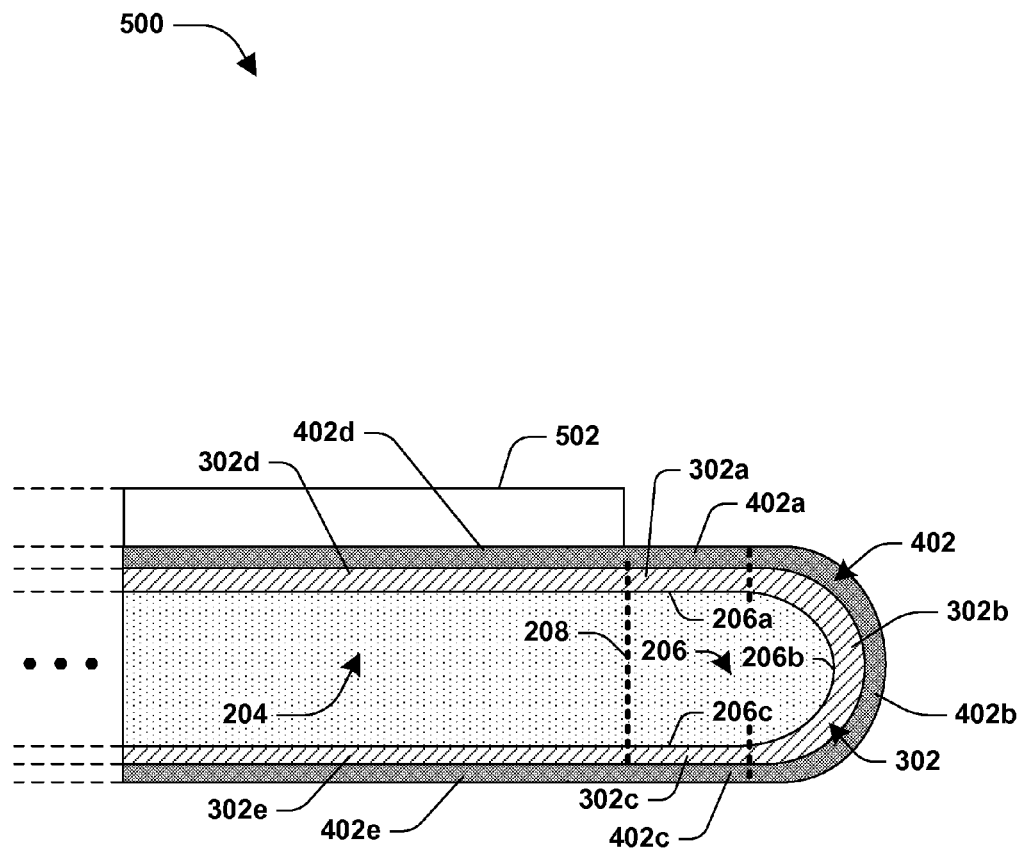
FIG. 5 is an illustration of a photoresist layer, according to some embodiments.

At 106, a photoresist layer 502 is formed over the second hard mask 402, as illustrated in embodiment 500 of FIG. 5. The photoresist layer 502 is not formed over the beveled wafer edge portion 206 of the substrate 204. In an embodiment, a photoresist coating technique is performed to form an initial photoresist layer covering a front or top side of the substrate 204, such as covering the top second hard mask portion 402d and the beveled top second hard mask portion 402a. A portion (not shown) of the photoresist layer covering the beveled wafer edge portion 206, such as a portion coving the beveled top second hard mask portion 402a, is removed to form the photoresist layer 502. In an embodiment, a wafer edge exposure or edge bead removal technique is performed to remove the portion of the photoresist layer.

Figure 6:
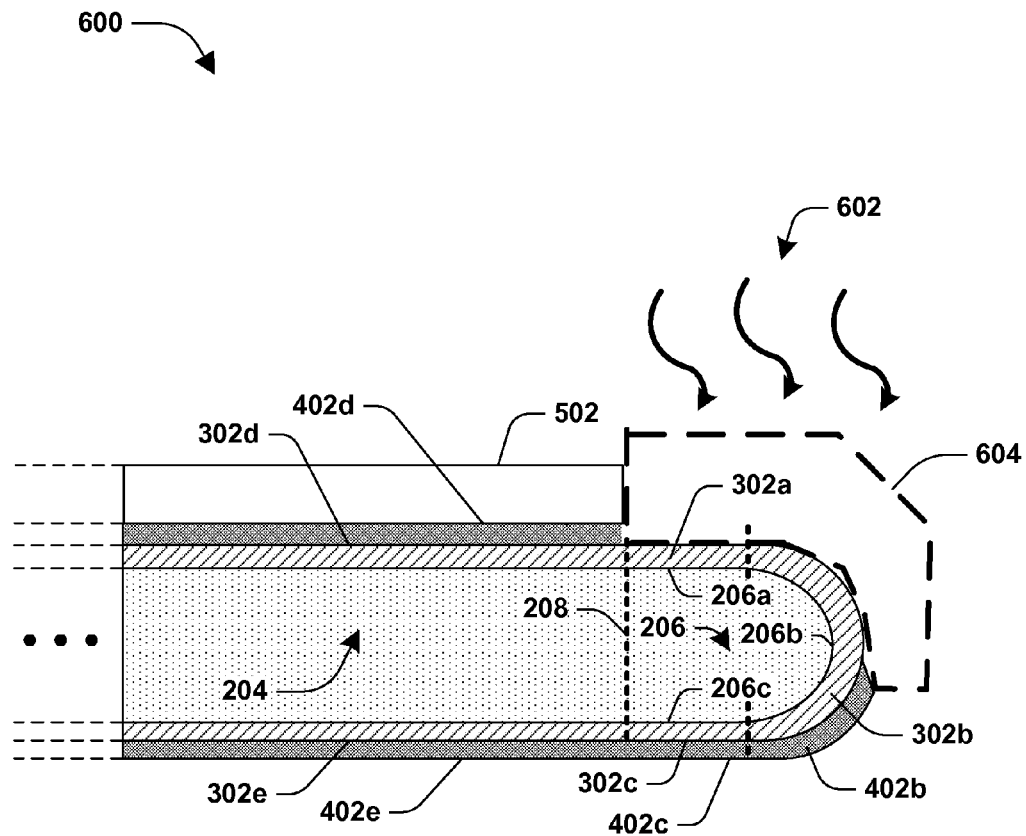
FIG. 6 is an illustration of removing a second hard mask portion of a second hard mask, according to some embodiments.

At 108, a second hard mask portion of the second hard mask 402 is removed to define a formation area 604 over the beveled wafer edge portion 206, as illustrated in embodiment 600 of FIG. 6. In an embodiment, a removal technique 602, such as a silicon nitride dry etch, is performed to remove the second hard mask portion. In an embodiment, the second hard mask portion that is removed comprises at least some of the beveled top second hard mask portion 402a and at least some of the beveled edge second hard mask portion 402b, thus defining the formation area 604. In an embodiment, a photo resist strip is performed to remove the photoresist layer 502 after the second hard mask portion of the second hard mask 402 is removed.

Figure 7:
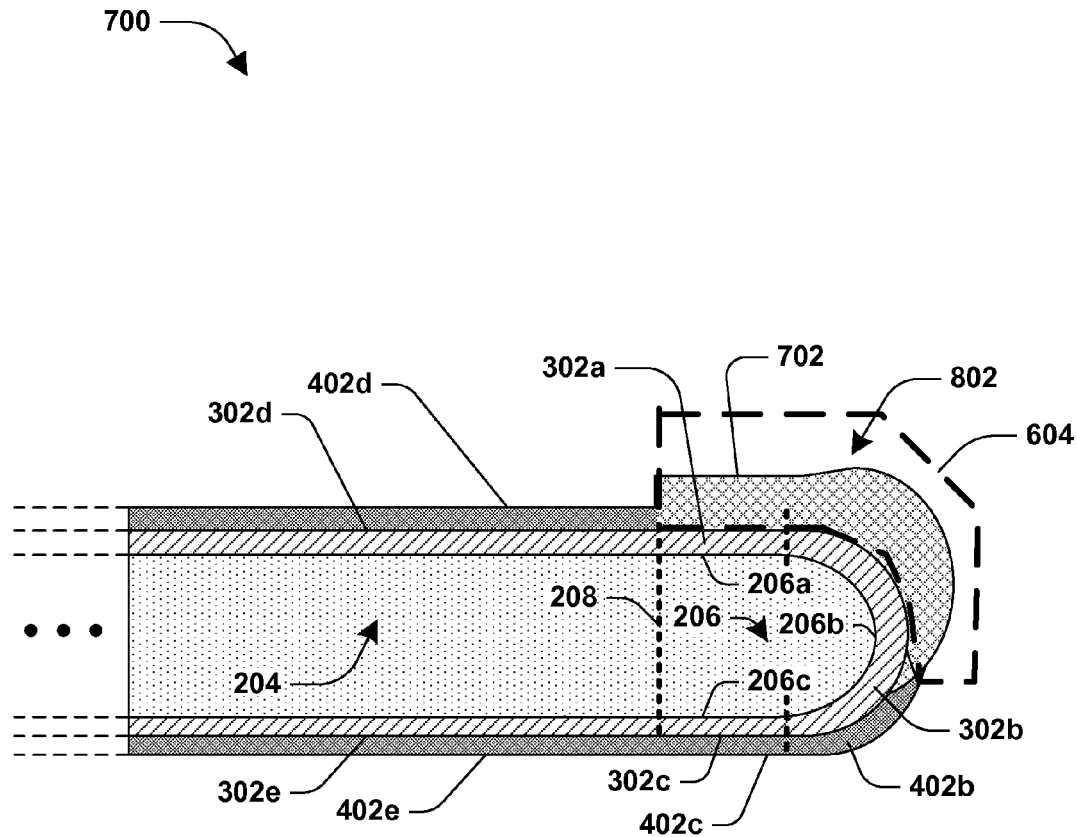
FIG. 7 is an illustration of a formation area, according to some embodiments.
Figure 8:
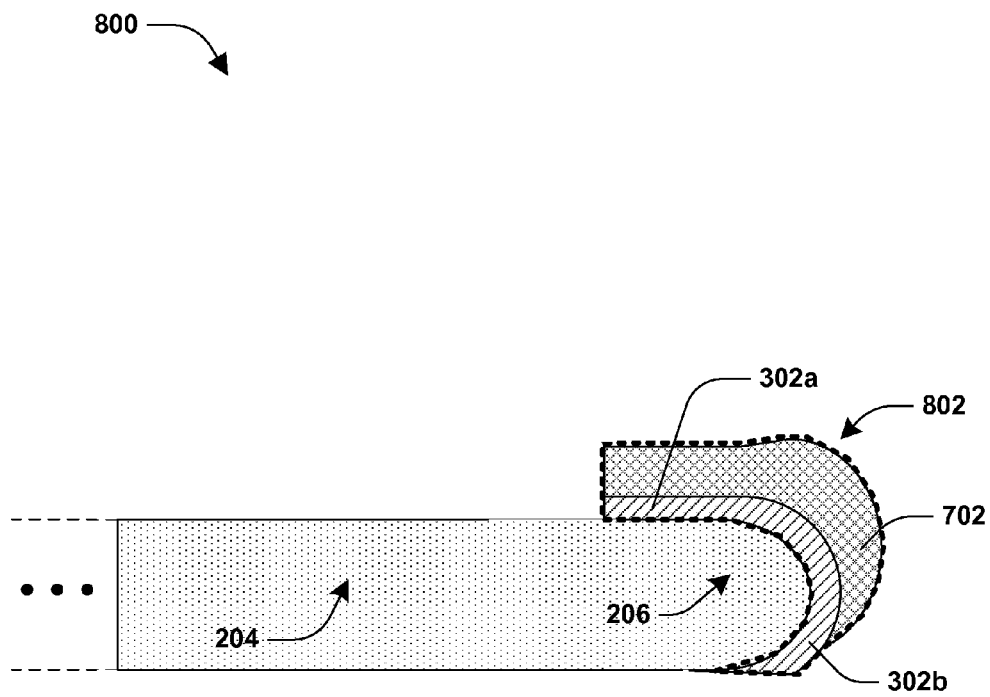
FIG. 8 is an illustration of a wafer edge protection structure, according to some embodiments.

At 110, a wafer edge protection structure 802 is formed within the formation area 604, as illustrated in embodiment 700 of FIG. 7 and embodiment 800 of FIG. 8. In an embodiment, a formation technique is performed to form an Epi growth resistant material 702, such as an amorphous or non-crystalline material, within the formation area 604, as illustrated in embodiment 700 of FIG. 7. In an embodiment, an oxide growth technique, such as a thermal oxide growth technique, is performed to grow oxide within the formation area 604 as the Epi growth resistant material 702. In an embodiment, the wafer edge protection structure 802 comprises the Epi growth resistant material 702 and at least a portion of the first hard mask 302, such as at least some of the beveled top first hard mask portion 302a or at least some of the beveled edge first hard mask portion 302b, as illustrated in embodiment 800 of FIG. 8. In an embodiment, the second hard mask 402 is removed after formation of the wafer edge protection structure 802, such as by a silicon nitride wet removal technique (e.g., $H_3PO_4$). In an embodiment, at least a portion of the first hard mask 302, not comprised within the wafer edge protection structure 802, is removed, such as by a thermal oxide removal technique. In this way, the wafer edge protection structure 802 mitigates Epi growth on the beveled wafer edge portion 206, which reduces particle contamination of the semiconductor wafer that would otherwise result from cracking or peeling of an Epi film that would have been formed from the Epi growth.

Figure 9:
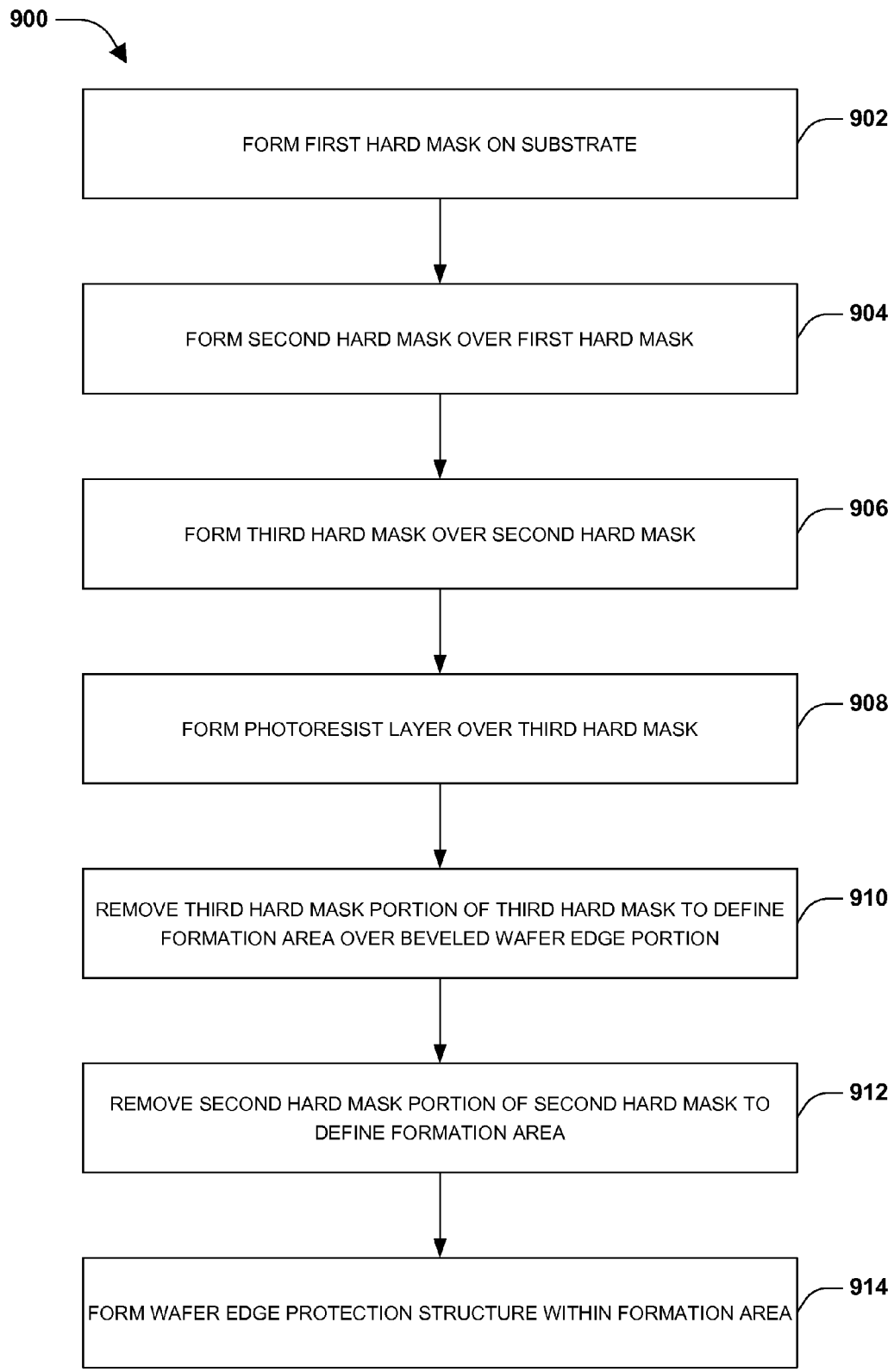
FIG. 9 is a flow diagram illustrating a method of forming a wafer edge protection structure for a beveled wafer edge portion of a semiconductor wafer, according to some embodiments.
Figure 10:
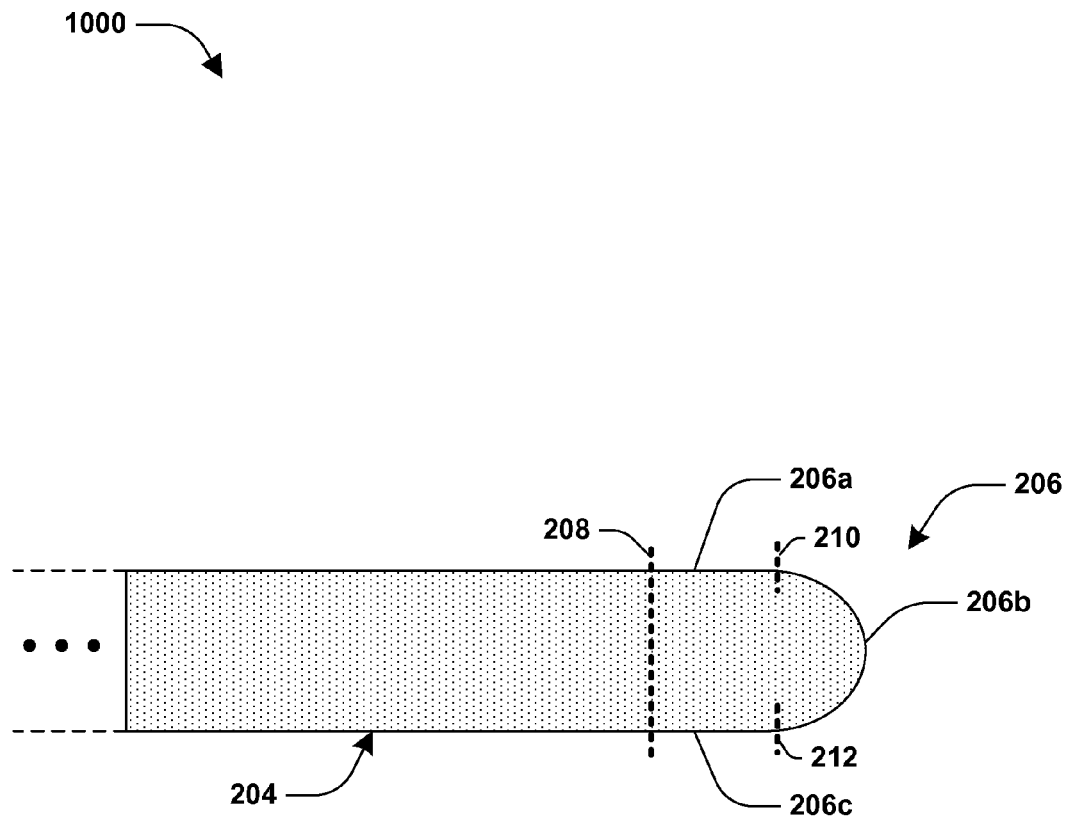
FIG. 10 is an illustration of a substrate comprising a beveled wafer edge portion, according to some embodiments.

A method 900 of forming a wafer edge protection structure for a beveled wafer edge portion of a semiconductor wafer is illustrated in FIG. 9, and one or more wafer edge protection structures formed by such a methodology are illustrated in FIGS. 10-18. A semiconductor wafer comprises a substrate 204, as illustrated in embodiment 1000 of FIG. 10. The substrate 204 comprises a beveled wafer edge portion 206 (e.g., an edge region of the substrate 204 to the right of a line 208). In some embodiments, the beveled wafer edge portion 206 comprises a top beveled wafer edge portion 206a (e.g., between line 208 and line 210), a side beveled wafer edge portion 206b (e.g., between line 210 and line 212), a bottom beveled wafer edge portion 206c (e.g., between line 212 and line 208), or other beveled wafer edge portions not illustrated. In this way, the beveled wafer edge portion 206 has a beveled shaped or other edge shape.

Figure 11:
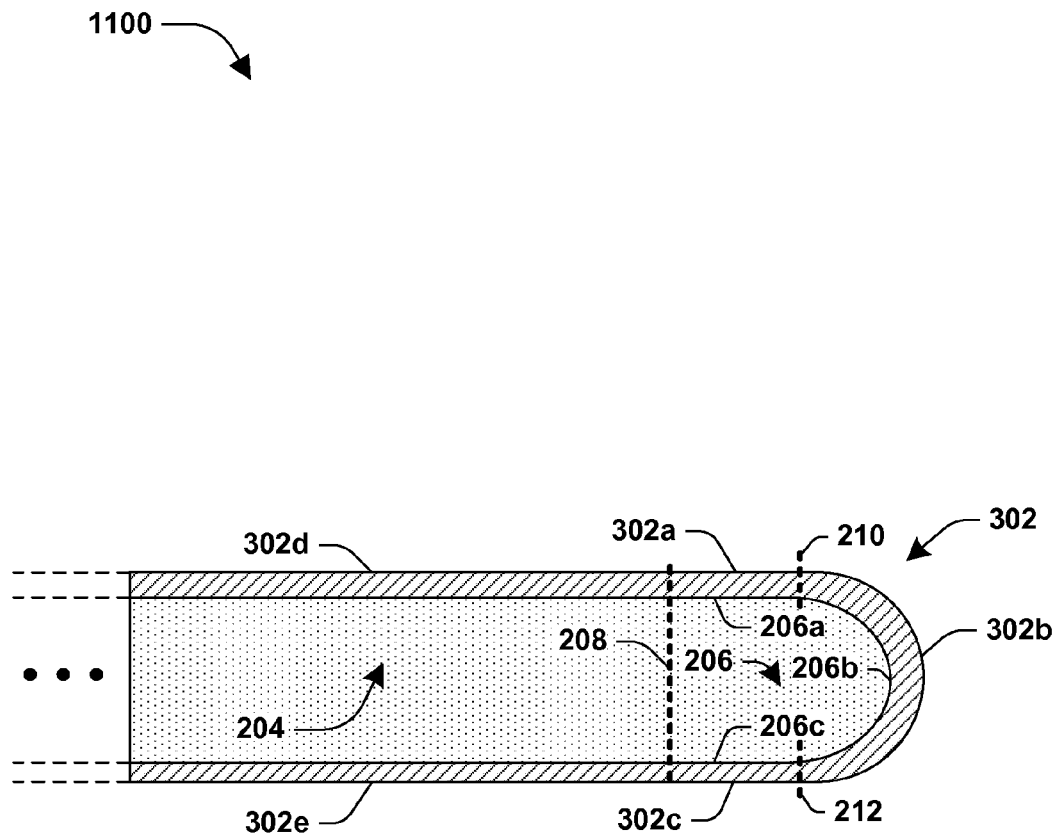
FIG. 11 is an illustration of first hard mask, according to some embodiments.

At 902, a first hard mask 302 is formed on the substrate 204 of the semiconductor wafer, as illustrated in embodiment 1100 of FIG. 11. In an embodiment, the first hard mask 302 comprises an amorphous material, a non-crystalline material, or other material that is relatively less susceptible to Epi growth than the substrate 204. In an embodiment, the first hard mask 302 comprises an oxide material. In an embodiment, an oxide growth technique, such as thermal oxide growth, is performed to form the first hard mask 302. In some embodiments, the first hard mask 302 comprises a top first hard mask portion 302d (e.g., to the left of the line 208), a beveled top first hard mask portion 302a (e.g., between the line 208 and the line 210), a beveled edge first hard mask portion 302b (e.g., between the line 210 and the line 212), a beveled bottom first hard mask portion 302c (e.g., between the line 212 and the line 208), a bottom first hard mask portion 302e (e.g., to the left of the line 208), or other portions not illustrated. In an embodiment, the beveled top first hard mask portion 302a, the beveled edge first hard mask portion 302b, and the beveled bottom first hard mask portion 302c are formed on the beveled wafer edge portion 206. In an embodiment, the first hard mask 302 is formed to a thickness between about 50 A and 100 A. In an embodiment, the first hard mask 302 wraps around the beveled wafer edge portion 206 from a front or top side of the substrate 204, around the beveled edge portion 206, to a back or bottom side of the substrate 204.

Figure 12:
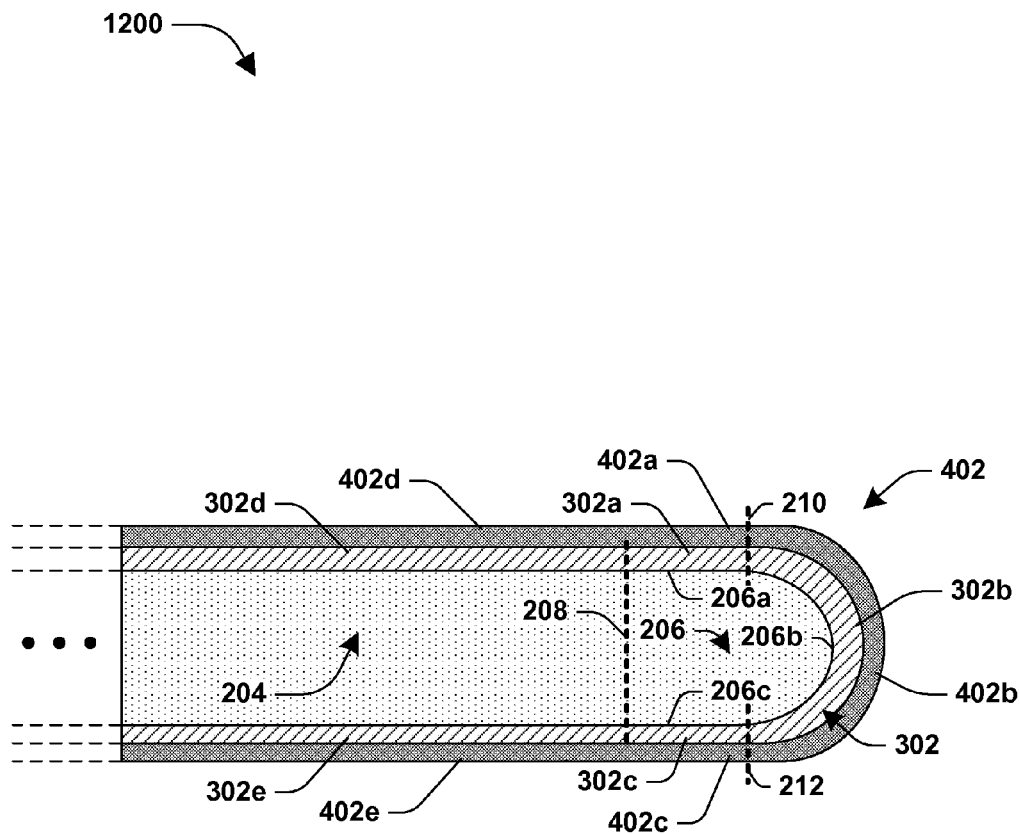
FIG. 12 is an illustration of a second hard mask, according to some embodiments.
Figure 13:
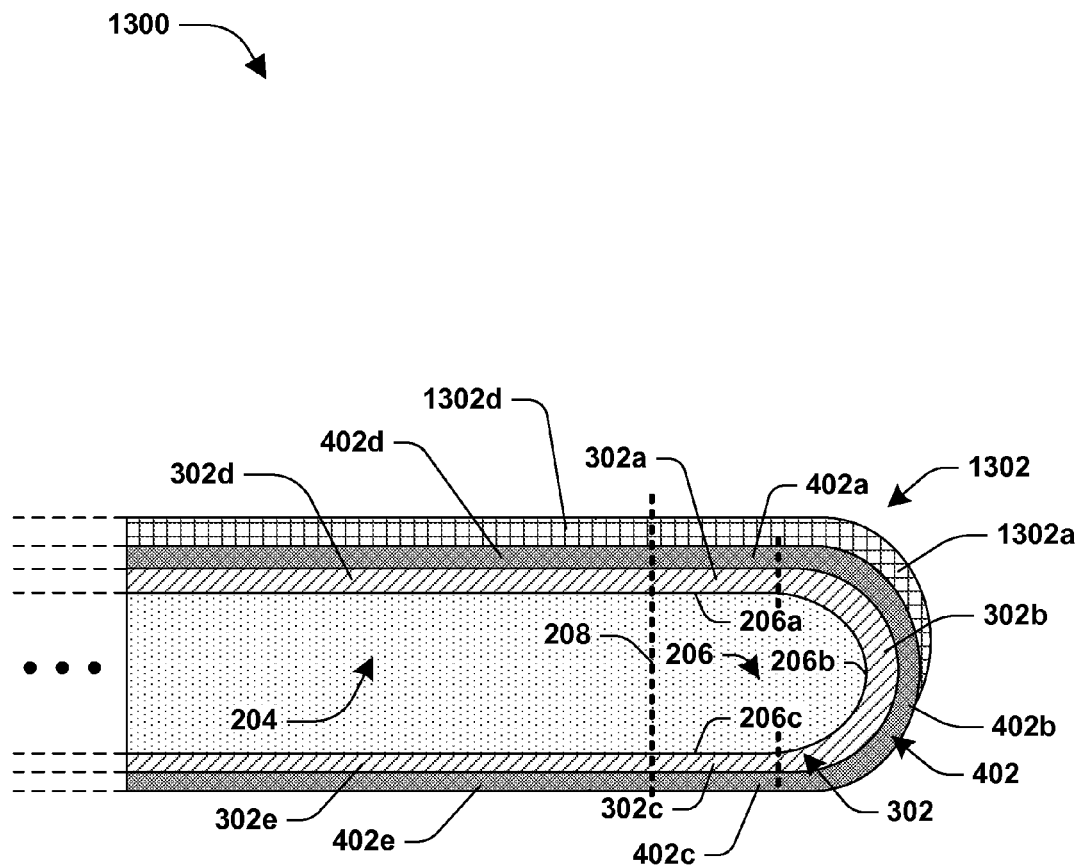
FIG. 13 is an illustration of a third hard mask, according to some embodiments.

At 904, a second hard mask 402 is formed over the first hard mask 302, as illustrated by embodiment 1200 of FIG. 12. In an embodiment, the second hard mask 402 comprises nitride, silicon nitride, or other material. In an embodiment, a nitride growth technique is performed to form the second hard mask 402. In some embodiments, the second hard mask 402 comprises a top second hard mask portion 402d (e.g., to the left of the line 208), a beveled top second hard mask portion 402a (e.g., between the line 208 and the line 210), a beveled edge second hard mask portion 402b (e.g., between the line 210 and the line 212), a beveled bottom second hard mask portion 402c (e.g., between the line 212 and the line 208), a bottom second hard mask portion 402e (e.g., to the left of line 208), or other portions not illustrated. In an embodiment, the beveled top second hard mask portion 402a, the beveled edge second hard mask portion 402b, and the beveled bottom second hard mask portion 402c are formed on the beveled wafer edge portion 206. In an embodiment, the second hard mask 402 wraps around the beveled wafer edge portion 206 from a front or top side of the substrate 204, around the beveled edge portion 206, to a back or bottom side of the substrate 204.

At 906, a third hard mask 1302 is formed over the second hard mask 402. In an embodiment, the third hard mask 1302 comprises oxide. In an embodiment, an oxide deposition technique is performed to form the third hard mask 1302. In some embodiments, the third hard mask 1302 comprises a top third hard mask portion 1302d (e.g., to the left of the line 208), a beveled third hard mask portion 1302a, or other portions not illustrated. In an embodiment, the beveled third hard mask portion 1302a is formed on the beveled wafer edge portion 206.

Figure 14:
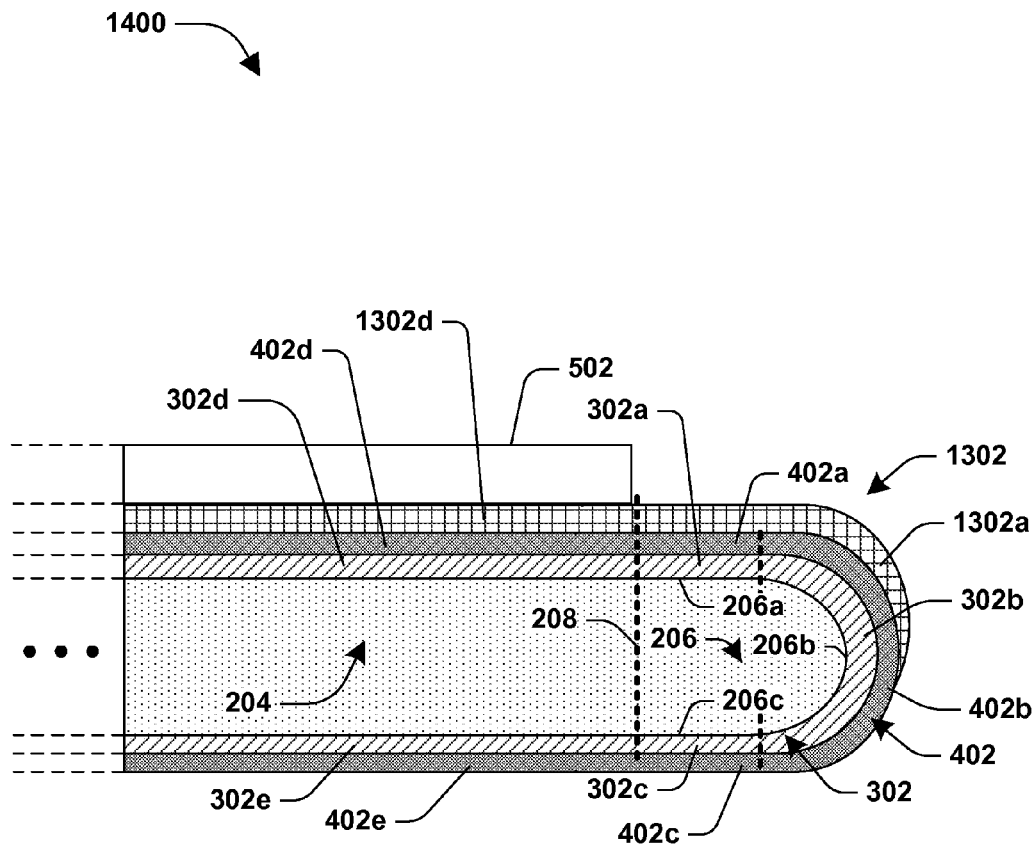
FIG. 14 is an illustration of a photoresist layer, according to some embodiments.

At 908, a photoresist layer 502 is formed over the third hard mask 1302, as illustrated in embodiment 1400 of FIG. 14. The photoresist layer 502 is not formed over the beveled wafer edge portion 206 of the substrate 204. In an embodiment, a photoresist coating technique is performed to form an initial photoresist layer covering a front or top side of the substrate 204, such as covering the top third hard mask portion 1302d and at least a portion of the beveled third hard mask portion 1302a. A portion (not shown) of the photoresist layer covering the beveled wafer edge portion 206, such as a portion coving the beveled third hard mask portion 1302a, is removed to form the photoresist layer 502. In an embodiment, a wafer edge exposure or edge bead removal technique is performed to remove the portion of the photoresist layer.

Figure 15:
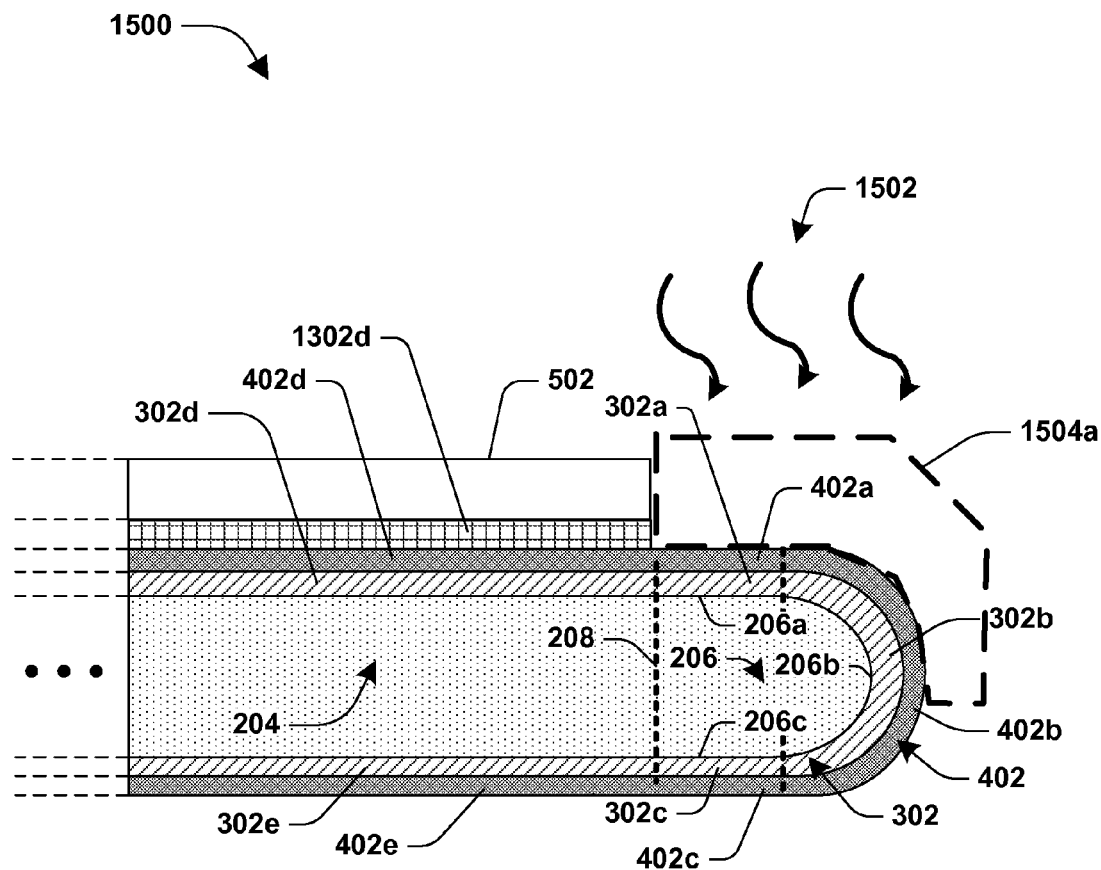
FIG. 15 is an illustration of removing a third hard mask portion of a third hard mask, according to some embodiments.

At 910, a third hard mask portion of the third hard mask 1302 is removed to defined a formation area 1504a over at least a portion of the beveled hard mask portion 206, as illustrated in embodiment 1500 of FIG. 15. In an embodiment, a removal technique 1502, such as an oxide removal technique, is performed to remove the third hard mask portion. In an embodiment, the third hard mask portion that is removed comprises the beveled third hard mask portion 1302a. In an embodiment, a photo resist strip is performed to remove the photoresist layer 502 after the third hard mask portion of the third hard mask 1302 is removed.

Figure 16:
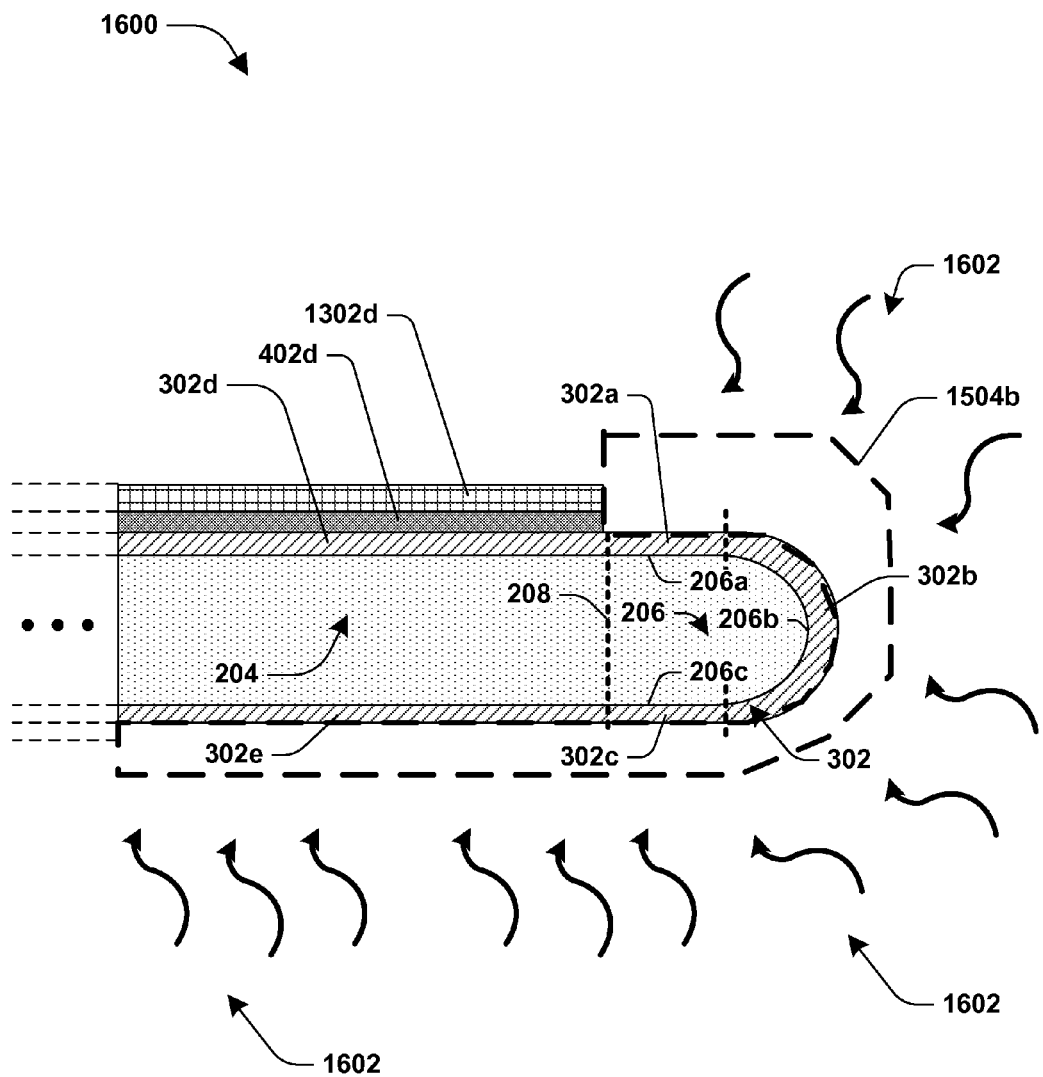
FIG. 16 is an illustration of removing a second hard mask portion of a second hard mask, according to some embodiments.

At 912, a second hard mask portion of the second hard mask 402 is removed to define the formation area 1504b, as illustrated in embodiment 1600 of FIG. 16. In an embodiment, the formation area 1504b corresponds to the formation area 1504a resulting from the removal of the third hard mask portion. In an embodiment, a removal technique 1602, such as a silicon nitride wet removal (e.g., $H_3PO_4$), is performed to remove the second hard mask portion. In an embodiment, the second hard mask portion that is removed comprises at least some of the beveled top second hard mask portion 402a, the beveled edge second hard mask portion 402b, the beveled bottom second hard mask portion 402c, and the bottom second hard mask portion 402e. In this way, the formation area 1504b is defined.

Figure 17:
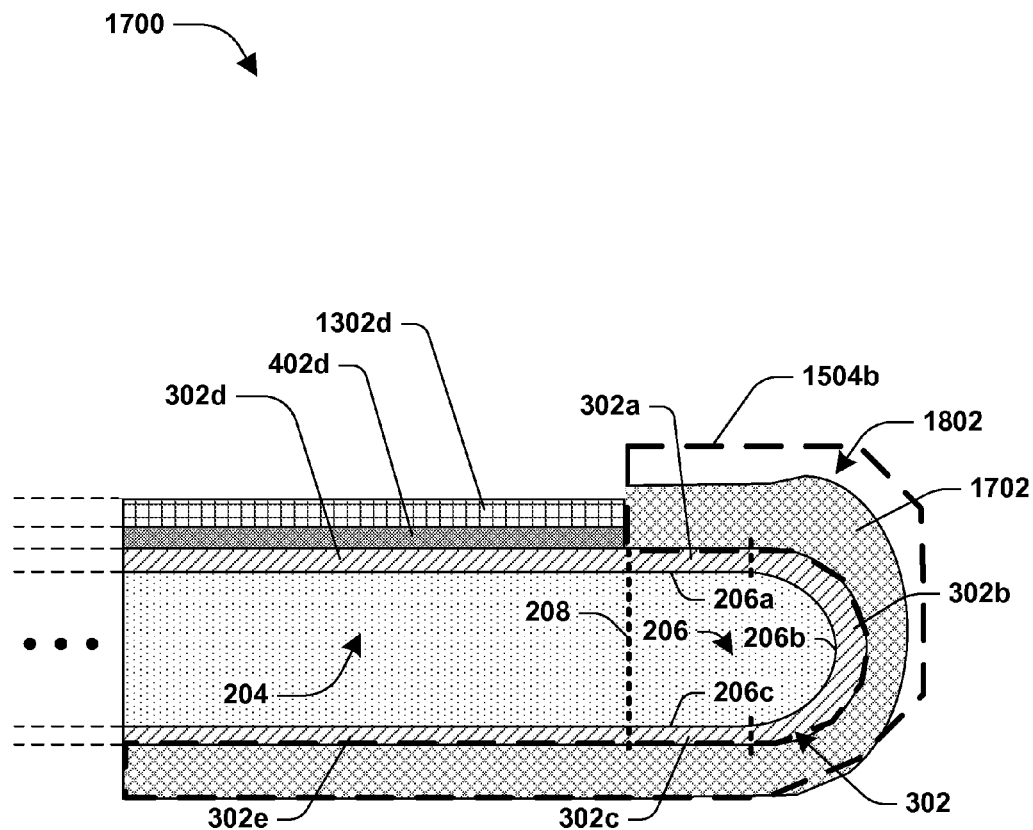
FIG. 17 is an illustration of a formation area, according to some embodiments.
Figure 18:
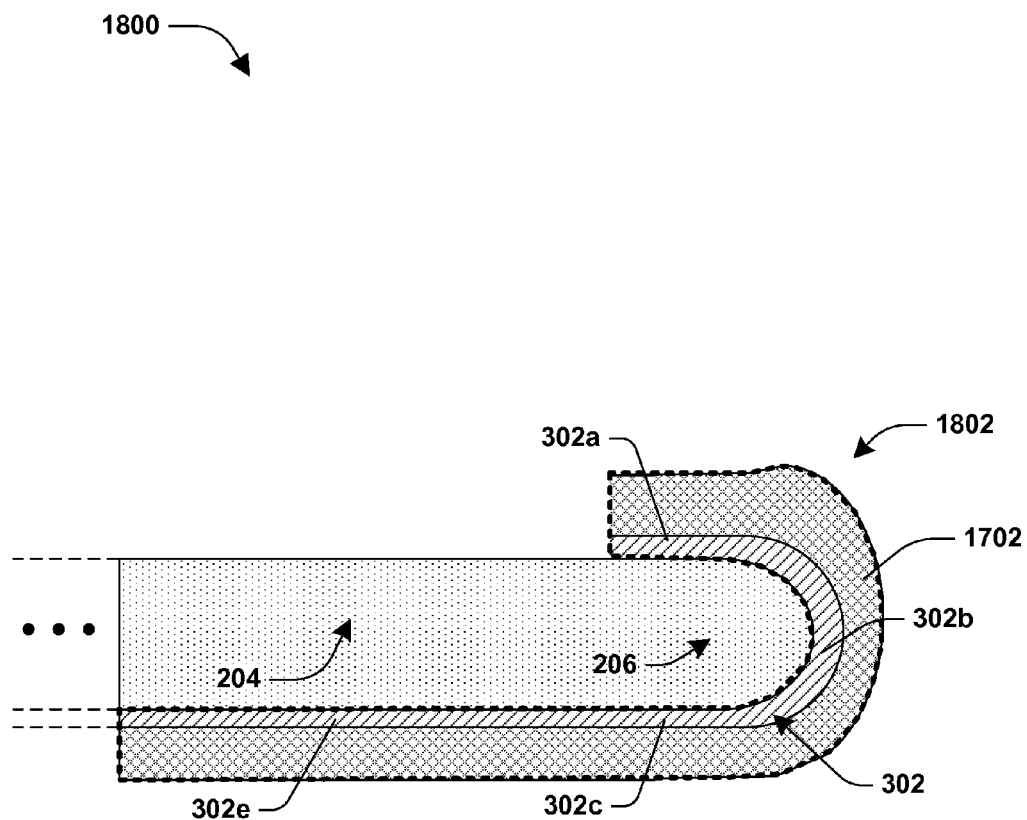
FIG. 18 is an illustration of a wafer edge protection structure, according to some embodiments.

At 914, a wafer edge protection structure 1802 is formed within the formation area 1504b, as illustrated in embodiment 1700 of FIG. 17 and embodiment 1800 of FIG. 18. In an embodiment, a formation technique is performed to form an Epi growth resistant material 1702, such as an amorphous or non-crystalline material, within the formation area 1504b, as illustrated in embodiment 1700 of FIG. 17. In an embodiment, an oxide growth technique, such as a thermal oxide growth technique, is performed to grow oxide within the formation area 1504b as the Epi growth resistant material 1702. In an embodiment, the wafer edge protection structure 1802 comprises the Epi growth resistant material 1702 and at least a portion of the first hard mask 302, such as the beveled top first hard mask portion 302a, the beveled edge first hard mask portion 302b, the beveled bottom first hard mask portion 302c, and the bottom first hard mask portion 302e, as illustrated in embodiment 1800 of FIG. 18. In this way, the wafer edge protection structure 1820 is formed from a front or top side of the substrate 204, around the beveled wafer edge portion 206, to a back or bottom side of the substrate 204. In an embodiment, the second hard mask 402 is removed after formation of the wafer edge protection structure 1802, such as by a silicon nitride wet removal technique (e.g., $H_3PO_4$). In an embodiment, at least a portion of the first hard mask 302, not comprised within the wafer edge protection structure 1802, is removed, such as by an oxide removal technique. In this way, the wafer edge protection structure 1802 mitigates Epi growth on the beveled wafer edge portion 206, which reduces particle contamination of the semiconductor wafer that would otherwise result from cracking or peeling of an Epi film that would have been formed from the Epi growth.

According to an aspect of the instant disclosure, a semiconductor wafer is provided. The semiconductor wafer comprises a substrate. The substrate comprises a beveled wafer edge portion that is susceptible to Epi growth, which results in undesirable particle contamination. Accordingly, the semiconductor wafer comprises a wafer edge protection structure. The wafer edge protection structure is formed over a top edge surface of the beveled wafer edge portion and a side edge surface of the beveled wafer edge portion. In an embodiment, the wafer edge protection structure comprises an Epi growth resistant material, such as an amorphous material, a non-crystalline material, or a hard mask material. In this way, Epi growth on the beveled wafer edge portion is mitigated.

According to an aspect of the instant disclosure, a method for forming a wafer edge protection structure for a beveled wafer edge portion of a semiconductor wafer is provided. The method comprises forming a first hard mask on a substrate of a semiconductor wafer. A second hard mask is formed over the first hard mask. A photoresist layer is formed over the second hard mask, but not formed over a beveled wafer edge portion of the substrate. A second hard mask portion of the second hard mask is removed to define a formation area over the beveled wafer edge portion. A wafer edge protection structure is formed within the formation area. In an embodiment, the wafer edge protection structure comprises an Epi growth resistant material, such as an amorphous material, a non-crystalline material, or a hard mask material. In this way, Epi growth on the beveled wafer edge portion is mitigated.

According to an aspect of the instant disclosure, a method for forming a wafer edge protection structure for a beveled wafer edge portion of a semiconductor wafer is provided. The method comprises forming a first hard mask on a substrate of a semiconductor wafer. A second hard mask is formed over the first hard mask. A third hard mask is formed over the second hard mask. A photoresist layer is formed over the third hard mask, but not formed over a beveled wafer edge portion of the substrate. A third hard mask portion of the third hard mask is removed to define a formation area over the beveled wafer edge portion. A second hard mask portion of the second hard mask is removed to further define the formation area over the beveled wafer edge portion. A wafer edge protection structure is formed within the formation area. In an embodiment, the wafer edge protection structure comprises an Epi growth resistant material, such as an amorphous material, a non-crystalline material, or a hard mask material. In this way, Epi growth on the beveled wafer edge portion is mitigated.

According to an aspect of the instant disclosure, a method for forming a wafer edge protection structure for a beveled wafer edge portion of a semiconductor wafer is provided. The method comprises forming a first hard mask on a substrate of a semiconductor wafer. In an embodiment, the first hard mask is formed over a front side surface, a beveled wafer edge portion, and a backside surface of the substrate. In an embodiment, an oxide growth technique is used to form the first hard mask. A negative photoresist coating is performed to form a photoresist. In an embodiment, a wafer edge exposure or edge bead removal technique is performed to remove undesired portions of the photoresist, such as a portion of the photoresist formed over the front side surface of the substrate. A first hard mask portion of the first hard mask is removed. In an embodiment, a hard mask etching technique is performed to remove the first hard mask portion. In an embodiment, the first hard mask portion covers the front side surface of the substrate, and is thus removed such that at least some of the remaining portion of the first hard mask is formed as the wafer edge protection structure. The photoresist is removed after formation of the wafer edge protection structure. In this way, the wafer edge protection structure is formed from the remaining first hard mask, and protects the beveled wafer edge portion and the backside surface of the substrate.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for embodiment, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor wafer, comprising:
   a substrate comprising a beveled wafer edge portion; and
   a wafer edge protection structure formed over a top edge surface of the beveled wafer edge portion and a side edge surface of the beveled wafer edge portion, the wafer edge protection structure comprising:
   an epitaxial growth resistant layer; and
   a hard mask.

2. The semiconductor wafer of claim 1, the wafer edge protection structure comprising an amorphous material.

3. The semiconductor wafer of claim 1, the hard mask situated between the epitaxial growth resistant layer and the substrate.

4. The semiconductor wafer of claim 1, the wafer edge protection structure comprising at least one of an oxide material or a non-crystalline material.

5. The semiconductor wafer of claim 1, the wafer edge protection structure formed over a bottom edge surface of the beveled wafer edge portion.

6. A method for forming a wafer edge protection structure for a beveled wafer edge portion of a semiconductor wafer, comprising:
   forming a first hard mask on a substrate of a semiconductor wafer;
   forming a second hard mask over the first hard mask;
   forming a photoresist layer over the second hard mask, the photoresist layer not formed over a beveled wafer edge portion of the substrate;
   removing a second hard mask portion of the second hard mask to define a formation area over the beveled wafer edge portion; and
   forming a wafer edge protection structure within the formation area.

7. The method of claim 6, the forming a first hard mask comprising:
   performing an oxide growth technique to form the first hard mask comprising oxide.

8. The method of claim 6, the forming a second hard mask comprising:

performing a nitride growth technique to form the second hard mask comprising nitride.

9. The method of claim 6, the forming a photoresist layer comprising:
   performing a photoresist coating technique to form an initial photoresist layer; and
   removing a portion of the initial photoresist layer covering the beveled wafer edge portion.

10. The method of claim 6, the forming a wafer edge protection structure comprising:
   performing an oxide growth technique to grow oxide within the formation area.

11. The method of claim 6, comprising:
   removing another hard mark portion of the second hard mask after the forming a wafer edge protection structure.

12. The method of claim 6, comprising:
   removing at least a portion of the first hard mask not comprised within the wafer edge protection structure.

13. A method for forming a wafer edge protection structure for a beveled wafer edge portion of a semiconductor wafer, comprising:
   forming a first hard mask on a substrate of a semiconductor wafer;
   forming a second hard mask over the first hard mask;
   forming a third hard mask over the second hard mask;
   forming a photoresist layer over the third hard mask, the photoresist layer not formed over a beveled wafer edge portion of the substrate;
   removing a third hard mask portion of the third hard mask to define a formation area over the beveled wafer edge portion;
   removing a second hard mask portion of the second hard mask to redefine the formation area and generate a redefined formation area; and
   forming a wafer edge protection structure within the redefined formation area.

14. The method of claim 13, the forming a first hard mask comprising:
   performing an oxide growth technique to form the first hard mask comprising oxide.

15. The method of claim 13, the forming a second hard mask comprising:
   performing a nitride growth technique to form the second hard mask comprising nitride.

16. The method of claim 13, the forming a third hard mask comprising:
   performing an oxide deposition technique to form the third hard mask comprising oxide.

17. The method of claim 13, the forming a wafer edge protection structure comprising:
   performing an oxide growth technique to grow oxide within the formation area.

18. The method of claim 13, comprising:
   removing another hard mask portion of the second hard mask after the forming a wafer edge protection structure.

19. The method of claim 13, comprising:
   removing at least a portion of the first hard mask not comprised within the wafer edge protection structure.

20. The method of claim 13, the forming a wafer edge protection structure comprising:
   forming the wafer edge protection structure over a backside of the substrate.

* * * * *